(12) United States Patent
Kaneko et al.

(10) Patent No.: US 9,343,265 B2
(45) Date of Patent: May 17, 2016

(54) CHARGED PARTICLE BEAM IRRADIATION APPARATUS

(71) Applicant: Hitachi High-Technologies Corporation, Minato-ku, Tokyo (JP)

(72) Inventors: Asako Kaneko, Tokyo (JP); Hisayuki Takasu, Tokyo (JP); Hirobumi Mutou, Tokyo (JP)

(73) Assignee: Hitachi High-Technologies Corporation, Tokyo (JP)

(*) Notice: Subject to any disclaimer, the term of this patent is extended or adjusted under 35 U.S.C. 154(b) by 31 days.

(21) Appl. No.: 14/370,763

(22) PCT Filed: Dec. 25, 2012

(86) PCT No.: PCT/JP2012/083439
§ 371 (c)(1),
(2) Date: Jul. 4, 2014

(87) PCT Pub. No.: WO2013/103107
PCT Pub. Date: Jul. 11, 2013

(65) Prior Publication Data
US 2014/0353151 A1 Dec. 4, 2014

(30) Foreign Application Priority Data
Jan. 6, 2012 (JP) .................................. 2012-000878

(51) Int. Cl.
*C23C 14/35* (2006.01)
*H01J 37/305* (2006.01)
(Continued)

(52) U.S. Cl.
CPC ............... *H01J 37/3053* (2013.01); *C23C 8/40* (2013.01); *C23C 14/505* (2013.01);
(Continued)

(58) Field of Classification Search
CPC ......... C23C 8/40; C23C 14/505; C23C 16/4586
See application file for complete search history.

(56) References Cited

U.S. PATENT DOCUMENTS

2004/0108067 A1* 6/2004 Fischione ................ G01N 1/32
156/345.38
2005/0118065 A1 6/2005 Hasegawa et al.
(Continued)

FOREIGN PATENT DOCUMENTS

JP 10-239259 A 9/1998
JP 2004-227842 A 8/2004
(Continued)

OTHER PUBLICATIONS

"Scanning Electron Microscope", Kanto Branch, Society of Electron Microscope of Japan, Kyoritsu Shuppan, Co., Ltd., p. 141.

*Primary Examiner* — Jason M Berman
(74) *Attorney, Agent, or Firm* — Miles & Stockbridge P.C.

(57) ABSTRACT

The purpose of the present invention is to provide a charged particle beam irradiation apparatus of a relatively simple structure which performs cooling on a sample or a sample stage. An aspect of the present invention comprises: a charged particle source; a sample stage; and a driving mechanism that comprises a transmission mechanism which transmits a driving force to move the sample stage. The charged particle beam irradiation apparatus comprises a container capable of accommodating an ionic liquid (12), wherein the container is disposed in a vacuum chamber. When the ionic liquid (12) is accommodated in the container, at least a portion of the transmission mechanism is provided at a position submerged in the ionic liquid (12).

17 Claims, 7 Drawing Sheets

(51) Int. Cl.
*C23C 14/50* (2006.01)
*C23C 16/458* (2006.01)
*C23C 8/40* (2006.01)
*H01J 37/20* (2006.01)
*H01J 37/16* (2006.01)
*H01J 37/18* (2006.01)

(52) U.S. Cl.
CPC ............ *C23C 16/4586* (2013.01); *H01J 37/16* (2013.01); *H01J 37/18* (2013.01); *H01J 37/20* (2013.01); *H01J 2237/002* (2013.01); *H01J 2237/2001* (2013.01); *H01J 2237/2002* (2013.01); *H01J 2237/28* (2013.01); *H01J 2237/3151* (2013.01); *H01J 2237/31749* (2013.01)

(56) References Cited

U.S. PATENT DOCUMENTS

| | | |
|---|---|---|
| 2006/0113488 A1 | 6/2006 | Motoi |
| 2008/0135752 A1 | 6/2008 | Motoi |
| 2009/0173882 A1 | 7/2009 | Kuwabata et al. |
| 2012/0112064 A1* | 5/2012 | Nagakubo ............ G01N 1/286 |
| | | 250/307 |

FOREIGN PATENT DOCUMENTS

| | | |
|---|---|---|
| JP | 2005-91094 A | 4/2005 |
| JP | 2005-109330 A | 4/2005 |
| JP | 2011-144692 A | 7/2011 |
| WO | WO 2004/065940 A1 | 8/2004 |
| WO | WO 2007/083756 A1 | 7/2007 |

* cited by examiner

FIG. 7

| Sample | Temperature |
|--------|-------------|
| 1 | |
| 2 | |
| 3 | |
| 4 | |
| 5 | |
| 6 | |
| 7 ⋮ | |

CHARGED PARTICLE BEAM IRRADIATION APPARATUS

TECHNICAL FIELD

The present invention relates to a charged particle beam irradiation apparatus including a vacuum container, and relates more specifically to a charged particle beam irradiation apparatus including a cooling mechanism that cools a sample which is an irradiation object of the charged particle beam, a sample stub for mounting the irradiation object thereon, or a driving mechanism for driving the sample stub.

BACKGROUND ART

An ion milling apparatus which is an aspect of a charged particle beam apparatus including a vacuum container is an apparatus in which a sample is arranged in an evacuated sample chamber, an argon ion beam energized to approximately 10 kV or less is irradiated to the sample, atoms are sprung out from the sample surface utilizing the physical sputtering phenomenon, and milling the sample under a stress-free state. The ion milling apparatus is used in preparing a sample for a scanning electron microscope for example.

The irradiation condition of the ion beam in preparing a sample for a scanning electron microscope is approximately 10 kV for the acceleration voltage and approximately 200 µA for the ion beam current for example. Under such condition, the calorie imparted to the sample by ion beam irradiation becomes approximately 2 J/s. In the ion milling apparatus, the ion beam irradiation range may exceed approximately φ5 mm and the milling time may exceed several hours. In a case of a sample with low melting point such as a polymer material and the like, because the temperature rise in milling for long hours is not negligible, cooling of the sample is required.

In Non Patent Literature 1, a cooling mechanism in which liquid nitrogen and a Peltier element for cooling a sample are used in a vacuum sample chamber is disclosed, and a cooling method in which a liquid nitrogen Dewar arranged outside the sample chamber and a sample stage are connected to each other using a copper braided wire and the like and a cooling method in which the liquid nitrogen Dewar and the sample stage are connected to each other by piping and are used as a coolant, are described.

In Patent Literature 1, an ion milling apparatus is disclosed in which a cooling gas passage is arranged in a substrate holder, and a milling object sample is cooled.

CITATION LIST

Patent Literature

Patent Literature 1: JP-A-2005-109330

Non Patent Literature

Non Patent Literature 1: Kanto Branch, Society of Electron Microscope of Japan, "Scanning Electron Microscope", Kyoritsu Shuppan, Co., Ltd. pp 141

SUMMARY OF INVENTION

Technical Problem

On the other hand, unlike the apparatus disclosed in Patent Literature 1, among the ion milling apparatuses, there is one in which milling is executed while changing the angle of incidence and the like of the beam with respect to the sample surface. In this case, although a tilting mechanism and a rotating mechanism come to be arranged in the sample stub that supports the sample, when both of such driving mechanism and cooling mechanism are to be incorporated in the sample stub, the structure becomes complicated. Also, when a heat transmission mechanism is to be interposed between a moving object such as a sample stage and such a non-moving object on which a cooling medium is arranged as described in Non Patent Literature 1, it is likely that the heat transmitting medium and other members may rub against each other and may be deteriorated, because the relative positions of the both changes.

Further, in such a scanning microscope that a semiconductor device is the measuring object, the number of the measuring objects possibly becomes several thousand per one wafer in such a case of evaluation of OPC (Optical Proximity Correlation) patterns and the like, there is a case that a thermal expansion of the wafer and image drift occur because of the heat generated in the sliding section of the sample stage and it becomes hard to position the field of view of the electron microscope at the measuring object position. Although it is also preferable to cool the sample and the sample stub in such scanning microscope, it is necessary again to incorporate both of the driving mechanism for driving the sample stub and the cooling mechanism, and the structure becomes complicated.

In the following, a charged particle beam irradiation apparatus including a vacuum container objecting to achieve cooling of a sample or a sample stub with comparatively simple structure will be described.

Solution to Problem

As an embodiment for achieving the object, a charged particle beam irradiation apparatus is proposed which includes a charged particle source which emits charged particles, a sample stub for mounting a sample which is irradiated with the charged particles emitted from the charged particle source thereon, a driving mechanism including a transmission mechanism which transmits a driving force to move the sample stub, a vacuum chamber maintaining atmosphere where the sample is placed in a vacuum state, and a container disposed in the vacuum chamber and accommodating an ionic liquid, wherein the container is arranged at such a position that at least a part of the transmission mechanism is submerged in the ionic liquid.

Advantageous Effects of Invention

Because the ionic liquid can maintain the liquid state in the vacuum atmosphere, by causing the driving force transmission mechanism of the driving mechanism in a submerging state, heat accumulation of the sample and the sample stub can be suppressed while transmitting the driving force.

Other objects, features and advantages of the present invention will be clarified by the description of the examples of the present invention regarding the attached drawings below.

BRIEF DESCRIPTION OF DRAWINGS

FIG. 7 is a drawing showing an example of a data base storing the control temperatures for each kind of the sample.

DESCRIPTION OF EMBODIMENTS

In the following, a charged particle beam apparatus effectively suppressing heat accumulation of a sample and a sample stub will be described.

Example 1

In the present example, an ion milling apparatus that prepares a sample of a scanning electron microscope and the like will be described. In the present example, particularly, an ion milling apparatus will be described which includes a cooling mechanism cooling a sample without directly connecting a liquid nitrogen Dewar arranged outside a sample chamber and a sample stage to each other by a copper make braided wire, coolant piping and the like.

In an ion milling apparatus as described below, it is required to change the angle of incidence of the ion beam to the sample surface from time to time. More specifically, in a stage on which the sample is arranged, a rotating mechanism for rotating the sample relative to the irradiated ion beam and a tilting mechanism are arranged. Therefore, it is hard to directly connect a liquid nitrogen Dewar and the like arranged outside a sample chamber and a sample stage to each other by a copper make braided wire, coolant piping and the like.

Accordingly, the apparatus of the present embodiment was configured to arrange a mechanism having a cooling medium using an ionic liquid capable of maintaining the liquid state in the vacuum in a sample chamber, and to arrange a mechanism for controlling the temperature of the cooling medium from the outside of the sample chamber and directly cooling the sample stage that contacts the cooling medium. Also, in the present example, an ion milling apparatus arranging a driving mechanism of the sample stage in the cooling medium using the ionic liquid and capable of executing both of the cooling of the sample stage and the rotation and swing drive of the sample stage will be described.

Figure 1:
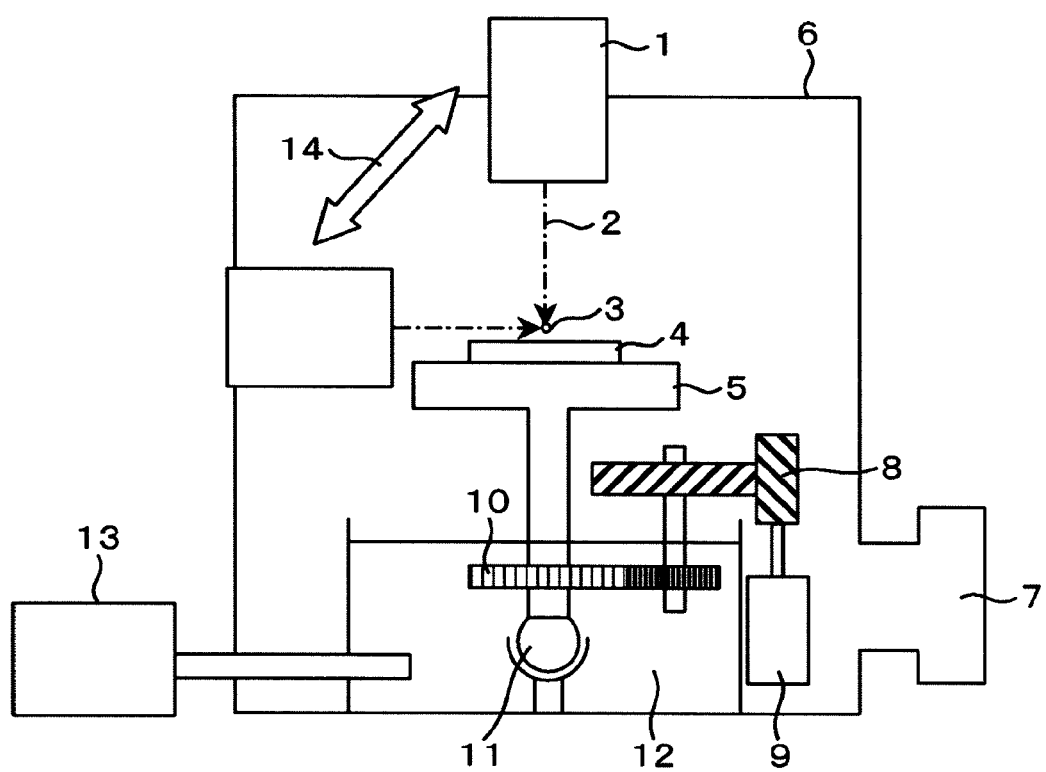
FIG. 1 is a drawing illustrating an example of an ion milling apparatus.

FIG. 1 is a drawing illustrating an example of an ion milling apparatus capable of controlling the sample temperature and including a sample stage. The ion milling apparatus exemplified in FIG. 1 is formed of an ion gun 1, a sample chamber 6, an evacuating pump 7, and a sample stage 5. The ion milling apparatus is an electron microscope sample pretreatment apparatus in which ions 3 are generated by the ion gun 1, atoms are sprung out from the surface of a sample 4 by irradiating an ion beam 2 from the ion gun 1 to the sample 4, and the sample 4 is milled flat in a stress-free state. In the present example, an ionic liquid 12 was used as a cooling medium for cooling the sample. A mechanism was provided in which the sample stage 5 was arranged so that a part of the sample stage 5 was submerged in the ionic liquid 12, a temperature controller 13 adjusting the temperature of the ionic liquid 12 was arranged, and the sample stage 5 and the sample 4 were directly cooled through the ionic liquid 12. Also, a mechanism was provided in which a worm gear 8 was rotated by a motor 9, fluctuation of rotation was transmitted to a spur gear 10, and the entire sample stage 5 was rotated using a universal joint 11 arranged in the lower part of the sample stage 5. Further, an ion gun moving mechanism capable of changing the irradiation angle of the ion beam 2 irradiated to the surface of the sample 4 was provided.

Because the ionic liquid that becomes a coolant contacts the driving mechanism so as to entirely cover the surface of the submerged driving mechanism as exemplified in FIG. 1, the cooling efficiency can be improved. Also, because the ionic liquid does not evaporate even in the vacuum chamber, the cooling mechanism can be arranged based on a simple configuration of arranging a liquid tank.

Figure 2:
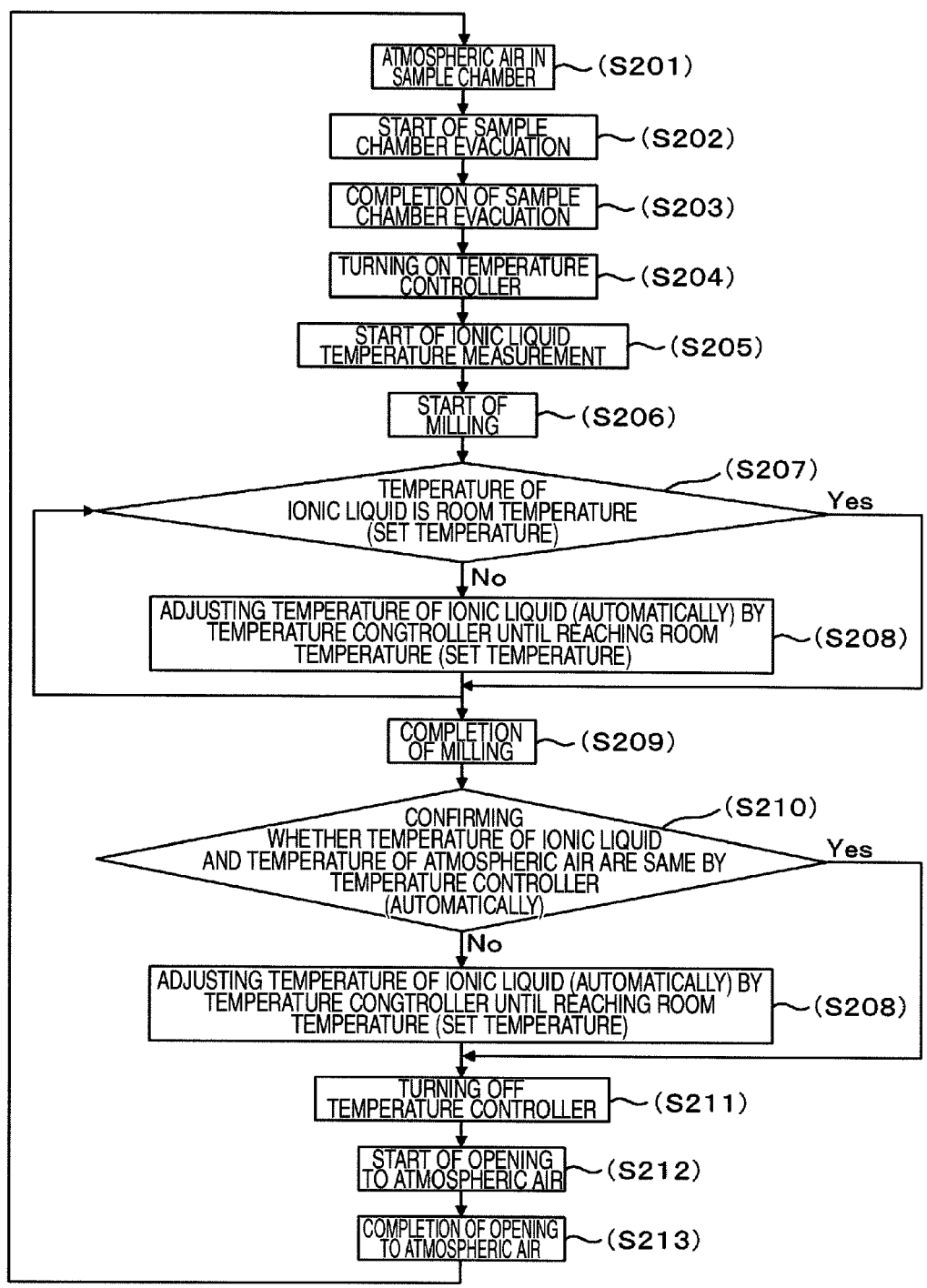
FIG. 2 is a flowchart showing milling steps by the ion milling apparatus involving the temperature control of a sample.

FIG. 2 is a flowchart showing a temperature adjusting step for the sample. The example of FIG. 2 explains a step for cooling the sample using a mechanism for directly cooling the sample stage 5 and the sample 4 through the ionic liquid 12 to which the temperature controller 13 is attached.

In the present example, the temperatures of the ionic liquid 12, the sample stage 5 and the sample during milling of the sample and in taking out the sample are managed properly by executing temperature control using the temperature controller 13 according to the motion of the ion milling apparatus.

First, the sample chamber (vacuum chamber) is opened to the atmospheric air (Step 201), the sample 4 is set to the sample stage 5 of the apparatus main body, and evacuation of the sample chamber is started (Step 202). After evacuation of the sample chamber is competed (Step 203), the temperature controller 13 is turned on (Step 204). At this time, temperature measurement of the ionic liquid is started in parallel using a temperature gage built in the temperature controller 13 (Step 205).

In the state described above, milling of the sample using the ion beam is started (Step 206). In a state that the milling is executed, whether the temperature of the ionic liquid maintains the room temperature (set temperature) or not is confirmed using the temperature controller 13 (Step 207). During the milling, when the temperature of the ionic liquid is the room temperature (set temperature), the state is continued until the completion of the milling (Step 209). On the other hand, when the temperature of the ionic liquid changes from the room temperature (set temperature) during the milling, temperature adjustment is executed until the temperature of the ionic liquid reaches the room temperature (set temperature) by the temperature controller (Step 208).

As described above, such control is executed using the temperature controller 13 that, during the milling using the ion beam, whether the temperature of the ionic liquid is maintained at a set temperature is confirmed, and when it is determined not to satisfy the set temperature, the temperature of the ionic liquid is made to the set temperature.

After completion of the milling (Step 209), the event that the temperature of the ionic liquid and the temperature of the atmospheric air are the same to each other is confirmed by the temperature controller (Step 210). At this time, when the temperature of the ionic liquid and the temperature of the atmospheric air are the same to each other, temperature control by the temperature controller is stopped (Step 211), and opening of the vacuum chamber to the atmospheric air is started (Step 212).

On the other hand, when the temperature of the ionic liquid and the temperature of the atmospheric air are different from each other, temperature adjustment is executed by the temperature controller until the temperature of the ionic liquid reaches the room temperature (set temperature) (Step 208). After the temperature adjustment, the control by the temperature controller is stopped, and opening to the atmospheric air is started (Steps 211, 212). When it is determined that the vacuum chamber has returned to the atmospheric air by a vacuum gage and a timer not illustrated, opening to the atmospheric air is terminated (Step 213).

As described above, by controlling the temperature of the sample stage to a predetermined temperature at the time of milling of the sample and before and after introducing the sample, thermal damage to the sample can be suppressed.

According to the example described above, in an electron microscope, an ion milling apparatus and the like, in milling of a sample having comparatively low melting point such as a polymer material without the limitation of the rotation and swing drive of the sample stage and using a cooling mechanism, thermal damage by the ion beam is reduced, and deformation of the sample and destruction of the structure by softening can be reduced.

Figure 3:
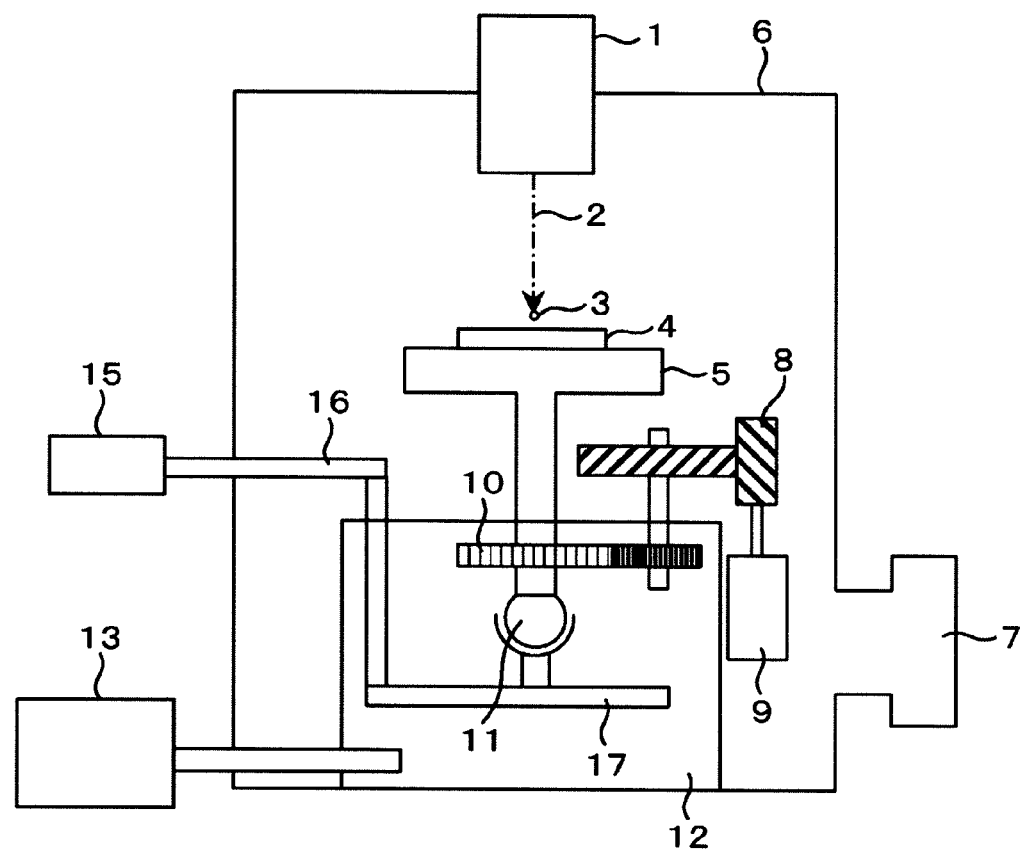
FIG. 3 is a drawing illustrating an example of an ion milling apparatus including a tilting mechanism.

FIG. 3 is a drawing explaining an example of adding a tilting mechanism to an ion milling apparatus of FIG. 1. In the ion milling apparatus exemplified in FIG. 3, the sample stage 5 is arranged on a stage base 17 that is capable of tilting motion. The stage base 17 is driven by a motor 15 through a driving shaft 16, and tilting reciprocating motion with a tilting axis of the driving shaft 16 is executed during irradiation of the ion beam. Because a part of the driving mechanism can be submerged in the ionic liquid 12 even in the configuration as exemplified in FIG. 3, the temperature can be properly managed by temperature control by the temperature controller 13.

Figure 4:
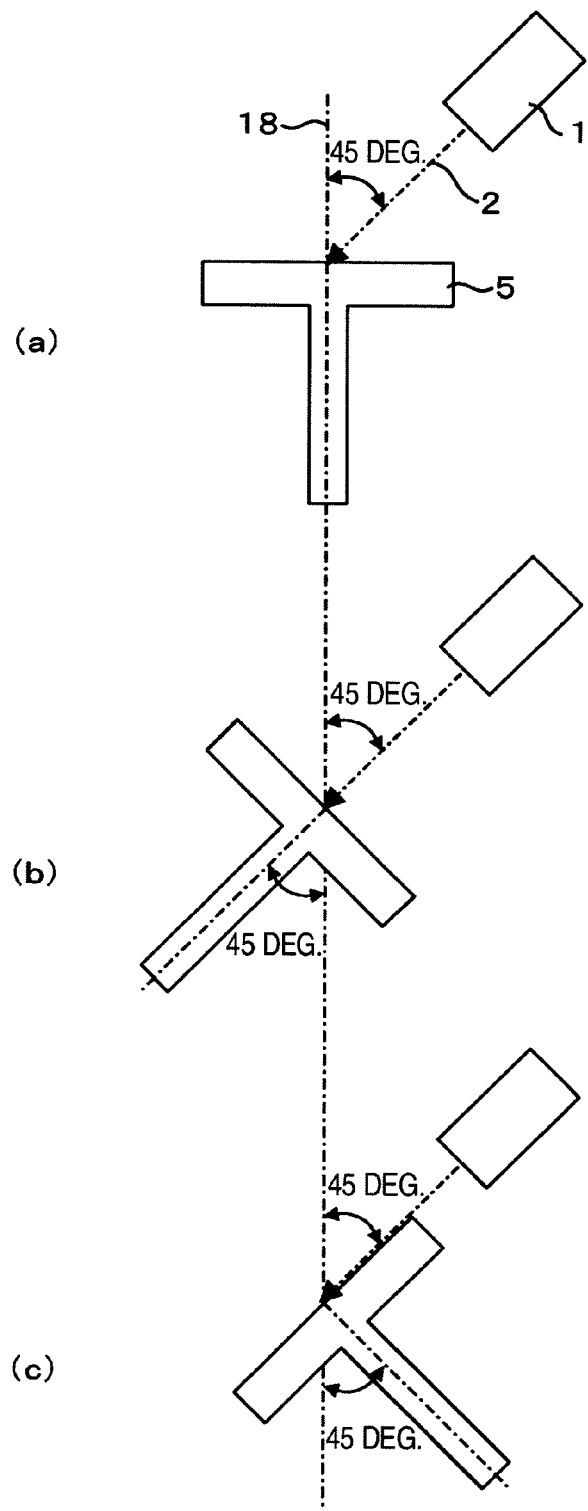
FIG. 4 is a drawing illustrating the relation between the position of an ion gun and the tilting angle of a sample stage.

FIG. 4 is a drawing illustrating the positional relationship between the positions of the ion gun 1 and the sample stage 5 in the ion milling apparatus. The tilting motion as exemplified in FIG. 3 is executed by the tilting mechanism exemplified in FIG. 3. The ion gun 1 is disposed at a position tilted by 45 degrees with respect to the vertical direction 18 of the apparatus, and when the inclination of the sample stage 5 shown in FIG. 4, (a) is 0 degree, the irradiation angle of the ions irradiated to the sample surface is 45 degrees. Similarly, when the sample holder surface shown in FIG. 4, (b) is tilted by 45 degrees relative to the ion gun direction, the ion irradiation angle irradiated to the sample surface is 0 degree. Also, when the sample holder surface shown in FIG. 4, (c) is tilted by 45 degrees toward the ion gun direction, the irradiation angle of the ions irradiated to the sample surface is 90 degrees. There is provided a mechanism capable of changing the irradiation angle of the ion beam irradiated to the sample surface by disposing the ion gun 1 beforehand at a position tilted with respect to the vertical direction 18 of the apparatus and tilting the sample stage 5 to the right and left in the cooling medium and a mechanism continuously cooling the sample stage 5 and the sample 4 without that the sample stage 5 directly submerged in the ionic liquid 12 which is the cooling medium goes out from the ionic liquid 12.

Example 2

Next, an electron microscope that is an aspect of a charged particle beam apparatus including a cooling mechanism with the ion liquid as the temperature transmission medium will be described using drawings.

Figure 6:
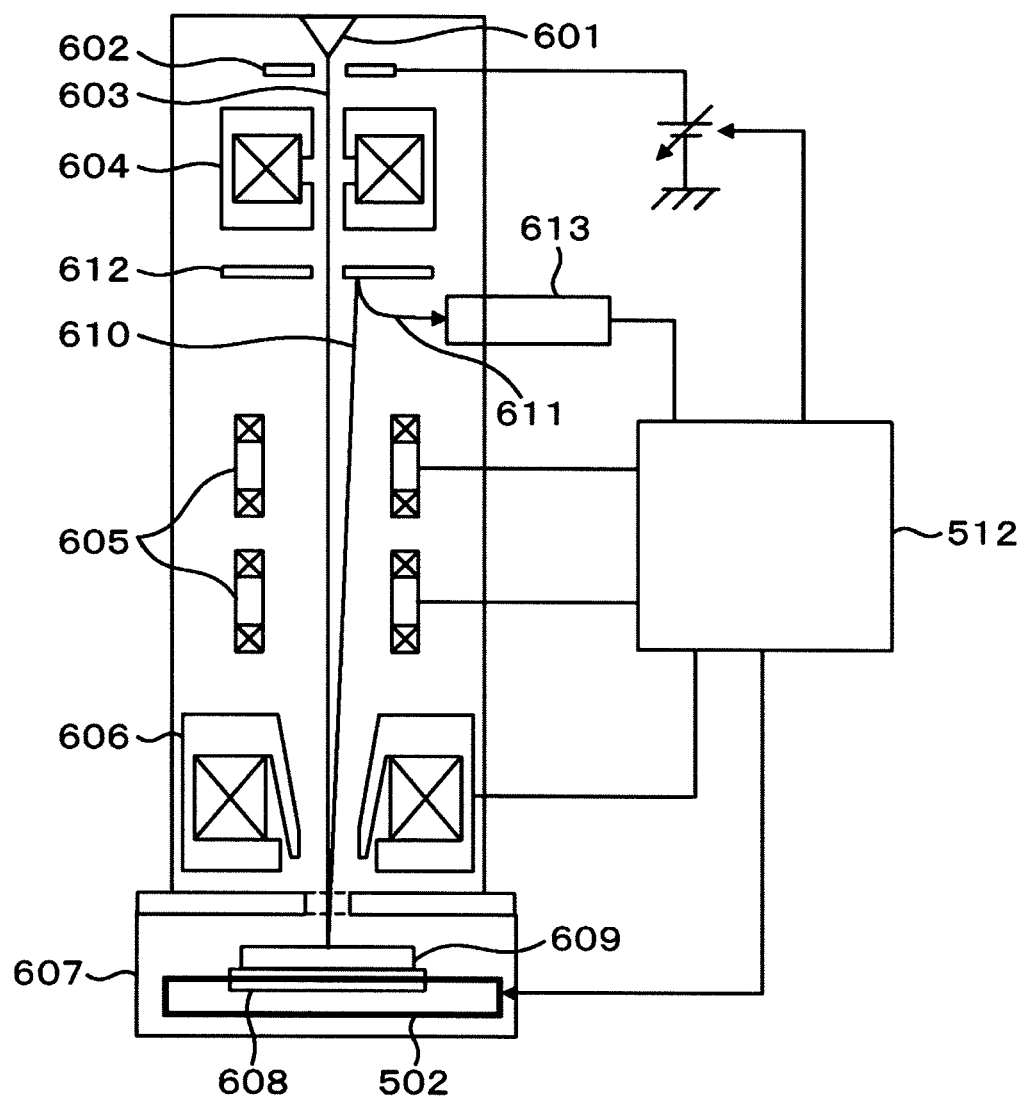
FIG. 6 is a drawing illustrating an example of a scanning electron microscope.

FIG. 6 is a drawing illustrating an outline of a scanning electron microscope (SEM) that is an aspect of the charged particle beam apparatus. Further, the present example will be described with an example of a SEM, however, the example below can also be applied to other charged particle beam apparatuses (for example a focused ion beam (FIB) apparatus) and electron beam plotting apparatuses that apply pattern plotting on a sample using an electron beam.

An electron beam 603 drawn out from an electron source 601 by a drawing out electrode 602 and accelerated by an acceleration electrode not illustrated is limited by a condenser lens 604 that is an aspect of a focusing lens, and is thereafter scanned one-dimensionally or two-dimensionally on a sample 609 by a scanning deflecting system 605. The electron beam 603 is decelerated by a negative voltage applied to an electrode built in a sample stub 608, is focused by a lens action of an object lens 606, and is irradiated onto the sample 609.

When the electron beam 603 is irradiated to the sample 609, electrons 610 such as secondary electrons and backscattered electrons are emitted from the irradiated position. The electrons 610 emitted are accelerated in the electron source direction by an acceleration action based on a negative voltage applied to the sample, collide on a conversion electrode 612, and generate secondary electrons 611. The secondary electrons 611 emitted from the conversion electrode 612 are captured by a detector 613, and the output of the detector 613 changes according to the amount of the captured secondary electrons. According to the output, the brightness of a display device not illustrated changes. When a two-dimensional image is formed for example, by synchronizing a deflection signal to the scanning deflecting system 605 and the output of the detector 613 with each other, an image of the scanned region is formed. Further, although a case that the electrons emitted from the sample is converted once by the conversion electrode and is detected is illustrated in the example of FIG. 3, the present invention is not limited to such configuration obviously, and such a configuration is also possible for example that an electron multiplier tube and the detection surface of the detector are disposed on the orbit of the accelerated electrons.

A control device 512 controls respective configurations of the scanning electron microscope, and has a function of forming an image based on the detected electrons and a function of measuring the pattern width of the pattern formed on the sample based on the intensity distribution of the detected electrons called as a line profile.

Also, a vacuum pump not illustrated is connected to a vacuum sample chamber 607, and the inner space thereof is evacuated. At least a part of the sample stub 608 is accommodated by a liquid tank 502.

Figure 5:
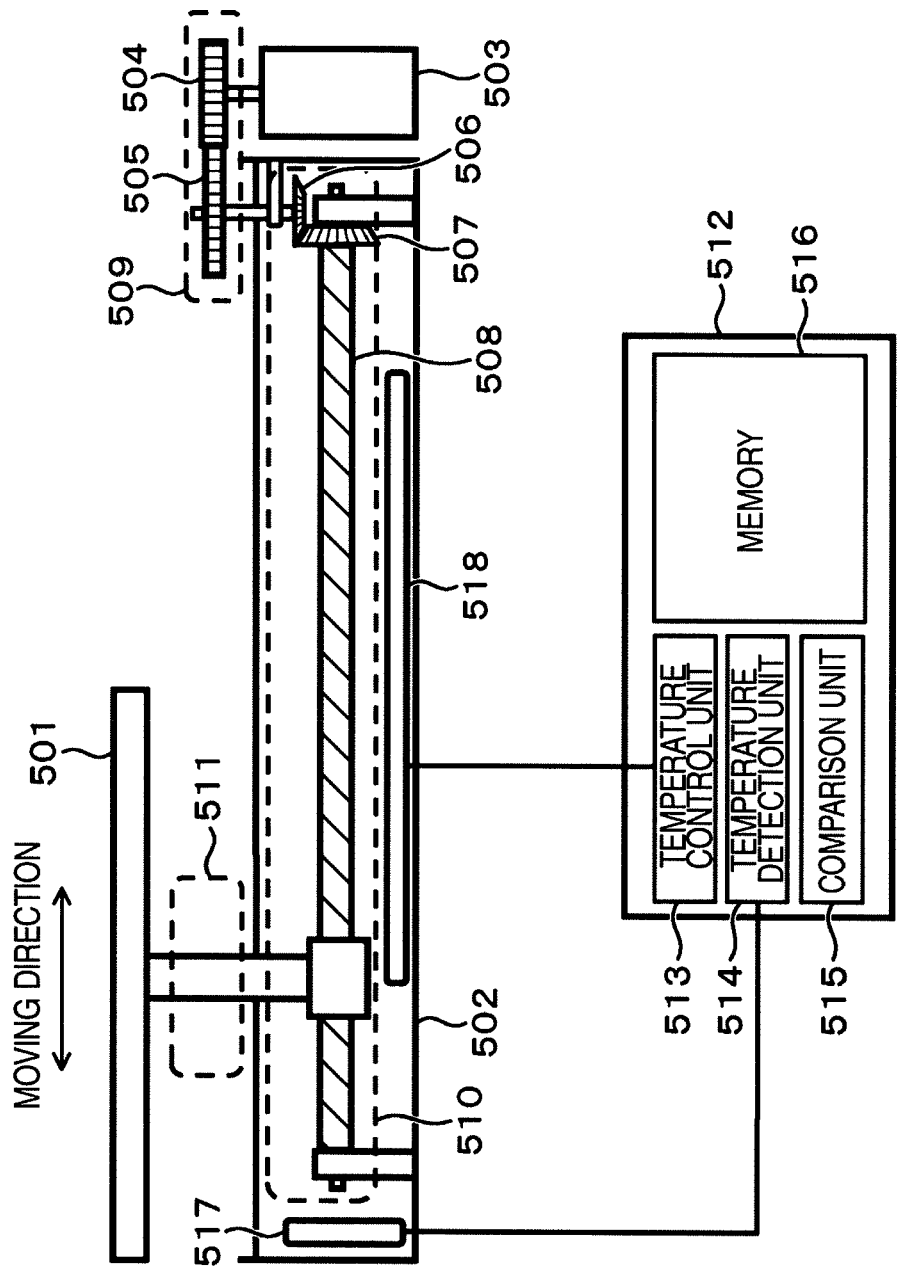
FIG. 5 is a drawing illustrating an example of a sample stage including a cooling mechanism.

FIG. 5 is a drawing illustrating the relation of machine elements forming a driving mechanism and the liquid tank 502 accommodating the ionic liquid that is a temperature transmission medium. The concept of the present example is that heat accumulation of the sample or the sample stub is suppressed by that at least a part of the driving force transmission passage from the power source to the sample (or sample stub) is submerged in the ionic liquid. FIG. 5 exemplifies an X-Y stage used for a charged particle beam irradiation apparatus of an electron microscope and the like. Although a driving force transmission mechanism of a stage of one direction (X-direction or Y-direction) will be illustrated to simplify the explanation in the present example, in the case of the X-Y stage, the driving force transmission mechanism exemplified in FIG. 5 is arranged in two directions.

Also, in Example 1, an example that the driving force transmission mechanism of the rotating mechanism and the tilting mechanism for the sample was submerged in the liquid tank accommodating the ionic liquid was illustrated, however, it is also possible, for example, that the driving mechanism for driving the stage mechanism of Z-direction (the optical axis direction of the beam in the case of an electron microscope) is submerged in the liquid tank. Further, in the case of the sample stage with high thermal conductivity, by cooling either one of the moving mechanism of X-direction and the moving mechanism of Y-direction, the sample can be also cooled, and therefore, in this case, even if the moving direction is in the two directions, either one (the moving mechanism positioned lower) only has to be submerged in the ionic liquid.

A stage 501 is configured to be movable in the illustrated direction by a driving force transmitted from a drive source 503 such as a motor through a gear 504, gear 505, bevel gear 506, bevel gear 507, and ball screw 508. A part of the stage mechanism is included in the liquid tank 502 that accommodates the ionic liquid.

Figure 7:
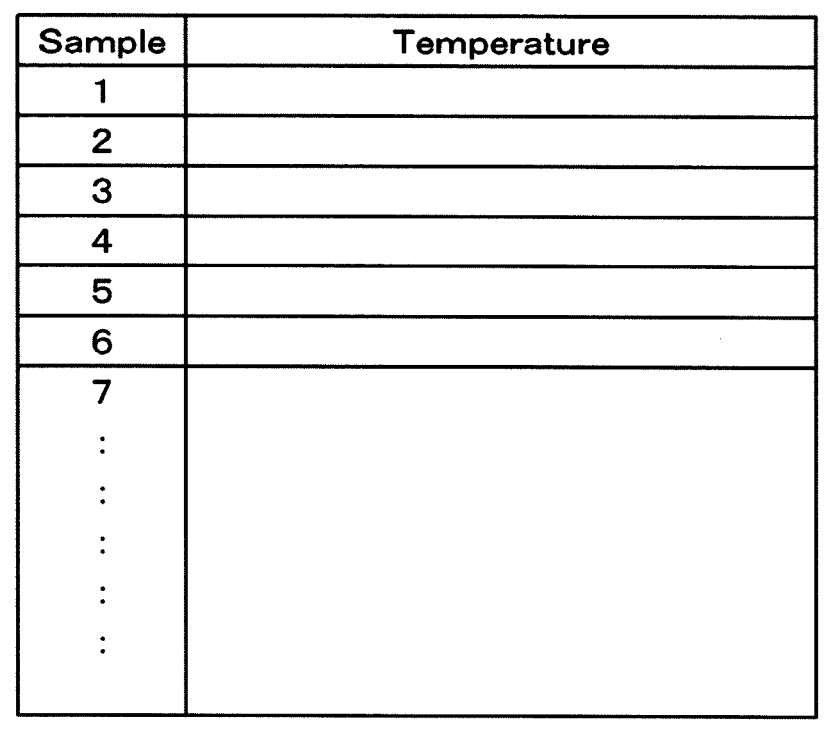

Also, in the liquid tank 502, a temperature gage 517 and a cooling mechanism 518 are arranged so as to be submerged in the ionic liquid. The cooling mechanism 518 is formed by a temperature control mechanism such as a Peltier element for example. Also, the temperature gage 517 and the cooling mechanism 518 are connected to the control device 512. In the control device 512, a temperature detection unit 514 measuring the temperature of the ionic liquid using the temperature gage 517, a comparison unit 515 calculating the difference of the temperature detected by the temperature detection unit 514 and the target temperature stored beforehand in a memory 516 and the like, and a temperature control unit 513 controlling the temperature control mechanism according to the difference obtained by the comparison unit 515 are built in. Also, in the memory 516, a data base storing appropriate temperature condition according to each kind of the sample as exemplified in FIG. 7 is registered.

In a SEM, although image drift and the like based on the temperature difference between the sample stub and the sample may possibly be generated, by managing the temperature using the ionic liquid as a temperature transmission medium as done in the present example, the temperature difference between the both can be reduced, and the image drift and the like can be suppressed as a result. Also, when the degree of the drift changes according to the kind of the sample, by constructing a data base as exemplified in FIG. 7 beforehand, the image drift can be suppressed regardless of the kind of the sample. Further, the stage temperature can be properly controlled even when the stage temperature rises by continuous movement of the stage.

When machine elements forming the driving mechanism exemplified in FIG. 5 are to be virtually divided into three, they are divided into a first machine element 509 nearest to the drive source 503, a second machine element 510 contacting the ionic liquid, and a third machine element 511 positioned between the second machine element 510 and the sample stub 501. The concept of the present example is to cool the sample or the sample stage by that at least the second machine element is submerged in the ionic liquid.

More specifically, the machine elements (for example the second machine element 510) which are the downstream machine elements to which the power is transmitted from the power source (for example the drive source 503) or from the machine elements (the upstream machine elements such as a gear, rack, pinion, gear, sprocket, shaft of gear and the like (for example, the first machine element 509)) to which the power is transmitted from the power source and which are positioned in the direction that the gravitational field is directed (below) from the power source or the upstream machine elements described above are submerged in the ionic liquid. Also, the second machine element transmits the power to the sample stub positioned above (the direction opposite to the direction that the gravitational field is directed) the ionic liquid or to the machine elements positioned above the ionic liquid and transmitting the power to the sample stub (for example the third machine element 511). By selectively submerging the second machine element in the ionic liquid thus, the heat transmitted from the sample stub can be released from the sample stub by heat exchanging with the ionic liquid. Because the ionic liquid stays on the bottom side of the container (liquid tank) by the gravity, by configuring the machine elements for power transmission so as to be extended downward once and to be extended upward thereafter, a part of the machine elements can be selectively submerged in the ionic liquid without submerging the power source and the sample stub (or the sample) in the ionic liquid.

According to such configuration, because the temperature transmission medium (ionic liquid) for cooling can be arranged in the vacuum chamber so as to be tightly attached to and to cover the surface of the machine elements, the sample or the sample stage can be cooled highly efficiently.

Although above description was made with respect to the examples, the present invention is not limited to it, and it is obvious for a person with an ordinary skill in the art that various changes and amendments can be effected within the range of the spirit and the attached claims of the present invention.

REFERENCE SIGNS LIST

1 . . . ion gun
2 . . . ion beam
3 . . . ion
4 . . . sample
5 . . . sample stage
6 . . . sample chamber
7 . . . evacuation pump
8 . . . worm gear
9, 15 . . . motor
10 . . . spur gear
11 . . . universal ball joint
12 . . . ionic liquid
13 . . . temperature controller
14 . . . ion gun moving mechanism
16 . . . driving shaft
17 . . . stage base
18 . . . vertical direction of apparatus

The invention claimed is:

1. A charged particle beam irradiation apparatus comprising:
   a charged particle source which emits charged particles;
   a sample stub for mounting a sample which is irradiated with the charged particles emitted from the charged particle source thereon;
   a driving mechanism including a transmission mechanism which transmits a driving force to move the sample stub;
   a vacuum chamber maintaining atmosphere where the sample is placed in a vacuum state; and
   a container disposed in the vacuum chamber and accommodating an ionic liquid,
   wherein the container is arranged at such a position that at least a part of the transmission mechanism is submerged in the ionic liquid.

2. The charged particle beam irradiation apparatus according to claim 1, further comprising:
   a temperature controlling mechanism controlling the temperature inside the container.

3. The charged particle beam irradiation apparatus according to claim 1, wherein
   the transmission mechanism includes a second mechanical element disposed in the direction that the gravitational field is directed with respect to a power source or a first mechanical element to which a driving force is transmitted from the power source, a driving force being transmitted to the second mechanical element from the first mechanical element; and
the second mechanical element is submerged in the ionic liquid.

4. The charged particle beam apparatus according to claim 1, wherein
the driving mechanism includes a rotating mechanism that rotates the sample, and
at least a gear included in the rotating mechanism is submerged in the ionic liquid.

5. The charged particle beam apparatus according to claim 1, wherein
the driving mechanism includes a tilting mechanism that tilts the sample, and
a portion tilted by the tilting mechanism is submerged in the ionic liquid.

6. The charged particle beam apparatus according to claim 5, wherein
the rotating mechanism that rotates the sample is arranged on the portion tilted by the tilting mechanism, and
at least a part of the rotating mechanism is submerged in the ionic liquid.

7. The charged particle beam irradiation apparatus according to claim 1, further comprising:
a temperature controlling mechanism that controls the temperature inside the container,
wherein the temperature controlling apparatus maintains the ionic liquid at a predetermined temperature.

8. The charged particle beam irradiation apparatus according to claim 1, wherein
the charged particle beam irradiation apparatus is an ion milling apparatus.

9. A charged particle beam irradiation apparatus comprising:
a charged particle source which emits charged particles;
a sample stub for mounting a sample which is irradiated with the charged particles emitted from the charged particle source thereon;
a driving mechanism including a transmission mechanism which transmits a driving force to move the sample stub;
a vacuum chamber maintaining atmosphere where the sample is placed in a vacuum state; and
a container disposed in the vacuum chamber and capable of accommodating an ionic liquid,
wherein the driving mechanism includes a first mechanical element to which a driving force is transmitted from a driving source for driving the sample stub, a second mechanical element to which a driving force is transmitted from the first mechanical element and which is positioned in the direction that the gravitational field is directed with respect to the first mechanical element, and a third mechanical element positioned between the second mechanical element and the sample stub, and
the container is positioned so that the second mechanical element is submerged in the ionic liquid.

10. The charged particle beam irradiation apparatus according to claim 9, further comprising:
a temperature controlling mechanism controls the temperature inside the container.

11. The charged particle beam irradiation apparatus according to claim 10, further comprising:
a temperature gage that detects the temperature inside the container, wherein
the temperature controlling mechanism controls the temperature of the ionic liquid based on the temperature detected by the temperature gage.

12. A charged particle beam irradiation apparatus comprising:
a charged particle source which emits charged particles;
a sample stub for mounting a sample which is irradiated with the charged particles;
a mechanical element which transmits a driving force from a power source to the sample stub; and
a vacuum chamber where the sample stab and the mechanical element are placed;
wherein a container accommodating an ionic liquid is disposed in the vacuum chamber, and at least a part of the mechanical element is in a state of submerging in the ionic liquid.

13. The charged particle beam irradiation apparatus according to claim 12, wherein the machine element in the state of submerging in the ionic liquid is a gear, rack, pinion, gear, sprocket, shaft of gear, spur gear, universal ball joint, bevel gear, or ball screw.

14. The charged particle beam irradiation apparatus according to claim 12, wherein the mechanical element in the state of submerging in the ionic liquid is a gear included in the rotating mechanism that rotates the sample.

15. The charged particle beam irradiation apparatus according to claim 12, further comprising a temperature controlling mechanism that controls a temperature of the ionic liquid.

16. The charged particle beam irradiation apparatus according to claim 13, further comprising a temperature controlling mechanism that controls a temperature of the ionic liquid.

17. The charged particle beam irradiation apparatus according to claim 14, further comprising a temperature controlling mechanism that controls a temperature of the ionic liquid.

* * * * *